United States Patent
Wang et al.

(10) Patent No.: US 12,001,193 B2
(45) Date of Patent: Jun. 4, 2024

(54) APPARATUS FOR ENVIRONMENTAL CONTROL OF DIES AND SUBSTRATES FOR HYBRID BONDING

(71) Applicant: Applied Materials, Inc., Santa Clara, CA (US)

(72) Inventors: Ying Wang, Singapore (SG); Xundong Dai, Singapore (SG); Guan Huei See, Singapore (SG); Ruiping Wang, San Jose, CA (US); Michael R. Rice, Pleasanton, CA (US); Hari Kishen Ponnekanti, San Jose, CA (US); Nirmalya Maity, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 342 days.

(21) Appl. No.: 17/692,671

(22) Filed: Mar. 11, 2022

(65) Prior Publication Data
US 2023/0288916 A1    Sep. 14, 2023

(51) Int. Cl.
*G05B 19/41* (2006.01)
*G05B 19/418* (2006.01)
(Continued)

(52) U.S. Cl.
CPC ...... *G05B 19/418* (2013.01); *H01L 21/67121* (2013.01); *H01L 21/68771* (2013.01);
(Continued)

(58) Field of Classification Search
CPC ........ G05B 19/418; G05B 2219/45031; H01L 21/67121; H01L 21/68771; H01L 21/68778; H01L 21/67248
See application file for complete search history.

(56) References Cited

U.S. PATENT DOCUMENTS 7,109,092 B2   9/2006   Tong
9,142,532 B2   9/2015   Suga et al.
(Continued)

FOREIGN PATENT DOCUMENTS

CN   112420549 A   *   2/2021   ............. H01L 21/67
KR   950033479 A   *   12/1995   ............. G01N 27/12
(Continued)

OTHER PUBLICATIONS

PCT International Search Report for PCT/US2023/014673 dated Jun. 27, 2023.

*Primary Examiner* — Mohammad Ali
*Assistant Examiner* — Kelvin Booker
(74) *Attorney, Agent, or Firm* — Moser Taboa (57) ABSTRACT

Apparatus for extending substrate queue time for hybrid bonding by preserving plasma activation. In some embodiments, the apparatus may include an environmentally controllable space with a support for holding a die or a substrate, a gas velocity accelerator that recirculates one or more gases laterally across the support, a filter, a humidifier apparatus that is fluidly connected to the environmentally controllable space, wherein the humidifier apparatus enables controllable humidity levels within the environmentally controllable space, a pressurizing apparatus fluidly connected to the humidifier apparatus on an output and fluidly connected to at least one gas supply on an input, a relative humidity (RH) sensor positioned within the environmentally controllable space, and an environment controller in communication with at least the humidifier apparatus and the RH sensor, wherein the environment controller is configured to maintain an RH level of approximately 80% to approximately 95%.

19 Claims, 5 Drawing Sheets

(51) Int. Cl.
*H01L 21/67* (2006.01)
*H01L 21/68* (2006.01)
*H01L 21/687* (2006.01)

(52) U.S. Cl.
CPC ............. H01L 21/68778 (2013.01); *G05B 2219/45031* (2013.01)

(56) References Cited

U.S. PATENT DOCUMENTS

| | | |
|---|---|---|
| 9,941,243 B2 | 4/2018 | Kim et al. |
| 10,297,567 B2 * | 5/2019 | Lu ............................ H01L 24/81 |
| 2006/0032582 A1 | 2/2006 | Chen et al. |
| 2008/0237181 A1 * | 10/2008 | Wagner ................. C23C 16/401 |
| | | 427/535 |
| 2011/0114994 A1 * | 5/2011 | Mandlik ............. H10K 50/805 |
| | | 257/E33.059 |
| 2016/0141191 A1 * | 5/2016 | Blake ................... G05B 19/418 |
| | | 700/282 |
| 2017/0047225 A1 * | 2/2017 | Suga ...................... H01L 21/187 |
| 2017/0133347 A1 | 5/2017 | Moriceau et al. |
| 2017/0179070 A1 * | 6/2017 | Lu ............................ H01L 24/75 |
| 2018/0003660 A1 * | 1/2018 | Tayebi ................ G01N 33/0006 |
| 2018/0068854 A1 | 3/2018 | Suga et al. |
| 2019/0295883 A1 | 9/2019 | Yokokawa |
| 2022/0067093 A1 * | 3/2022 | Su ....................... G01N 33/0001 |
| 2022/0262653 A1 * | 8/2022 | Harris .................. H01L 21/67121 |

FOREIGN PATENT DOCUMENTS

| | | | | |
|---|---|---|---|---|
| KR | 20100119780 A | * | 11/2010 | ............. H01L 21/20 |
| KR | 20210022403 A | * | 3/2021 | ............. H01L 21/67 |

* cited by examiner

APPARATUS FOR ENVIRONMENTAL CONTROL OF DIES AND SUBSTRATES FOR HYBRID BONDING

FIELD

Embodiments of the present principles generally relate to semiconductor processing of semiconductor substrates.

BACKGROUND

Dies are attached to substrates using a bonding process. When the dies have surface features comprising metal materials that are to connect with other metal materials on the substrate, the process is known as hybrid bonding due to the bonding of more than one type of material. To increase the bond or attraction of the dielectric materials between the dies and substrates, the dies and substrates are put through a plasma activation process prior to the bonding process. Initially, the dies are formed on a substrate which is singulated or cut apart to form the separate dies on a component wafer. The dies are picked from the component wafer and placed or bonded onto another substrate. Since a large number of dies are produced from one component wafer, a large amount of time may pass before all of the dies have been bonded to the other substrate. The longer the dies and substrates are waiting ("queue time"), the less activated the surfaces of the dies and substrate become. As the plasma activation diminishes, the bonding process produces voids or incomplete bonding between the dies and substrate, substantially decreasing the bonding yields.

Accordingly, the inventors have provided an apparatus for extending the queue time after plasma activation to dramatically improve hybrid bonding yields.

SUMMARY

Apparatus for extending hybrid bonding queue time after plasma activation are provided herein.

In some embodiments, an apparatus for extending a queue time of a die or a substrate for hybrid bonding may comprise an environmentally controllable space with a support for holding at least one die or substrate, a gas velocity accelerator that recirculates one or more gases laterally across the support, a filter which impedes on the one or more gases prior to the one or more gases flowing laterally across the support, a humidifier apparatus that is fluidly connected to the environmentally controllable space, wherein the humidifier apparatus enables controllable humidity levels within the environmentally controllable space, a pressurizing apparatus fluidly connected to the humidifier apparatus on an output and fluidly connected to at least one gas supply on an input, a relative humidity (RH) sensor positioned within the environmentally controllable space, and an environment controller in communication with at least the humidifier apparatus and the RH sensor.

In some embodiments, the apparatus may further include wherein the support holds multiple vertical stacks of dies or substrates in one or more columns, wherein the gas velocity accelerator is configured to recirculate the one or more gases at a velocity of approximately 60 feet per minute to approximately 120 feet per minute, wherein the environment controller is configured to maintain an RH level of approximately 80% to approximately 95%, wherein the filter is a high efficiency particulate air (HEPA) filter, a temperature sensor positioned within the environmentally controllable space, wherein the temperature sensor is in communication with the environment controller and wherein the environment controller is configured to maintain a temperature of less than approximately 100 degrees Celsius in the environmentally controllable space, a pressure sensor positioned within the environmentally controllable space, wherein the pressure sensor is in communication with the environment controller and wherein the environment controller is in communication with the pressurizing apparatus and is configured to maintain a pressure of less than approximately 60 PSI in the environmentally controllable space, wherein the humidifier apparatus is a gas bubbler with a cavity for a fluid in which gas may be introduced to allow the gas to be used as a carrier of the fluid into the environmentally controllable space, wherein the fluid contains deionized water, wherein the deionized water is chemically dosed with a surface passivation or reduction agent, tetramethylammonium hydroxide (TMAH), or acid, wherein the humidifier apparatus is a heated evaporator in communication with and controllable by the environment controller to alter levels of humidity within the environmentally controllable space, the apparatus positioned in a process chamber or bonder integrated into a cluster tool or as a standalone tool, the apparatus positioned in a non-processing area of a cluster tool, the apparatus integrated into a standalone storage station, the apparatus integrated into a substrate carrier, and/or the apparatus integrated into a factory interface (FI).

In some embodiments, an apparatus for extending a queue time of a die or a substrate for hybrid bonding may comprise an environmentally controllable space with a support for holding at least one substrate, wherein the environmentally controllable space is part of a cluster tool or a hybrid bonder chamber, an environmentally sealable port of the environmentally controllable space which is configured to receive at least one die or substrate from a plasma activation process chamber, a gas velocity accelerator configured to recirculate one or more gases laterally across the support at a velocity of approximately 60 feet per minute to approximately 120 feet per minute, a filter which impedes on the one or more gases prior to the one or more gases flowing laterally across the support, a humidifier apparatus that is fluidly connected to the environmentally controllable space, wherein the humidifier apparatus enables controllable humidity levels within the environmentally controllable space, a pressurizing apparatus fluidly connected to the humidifier apparatus on an output and fluidly connected to at least one gas supply on an input, a relative humidity (RH) sensor positioned within the environmentally controllable space, and an environment controller in communication with at least the humidifier apparatus and the RH sensor, wherein the environment controller is configured to maintain an RH level of approximately 80% to approximately 95%.

In some embodiments, the apparatus may further include a temperature sensor positioned within the environmentally controllable space, wherein the temperature sensor is in communication with the environment controller and wherein the environment controller is configured to maintain a temperature of less than approximately 100 degrees Celsius in the environmentally controllable space or a pressure sensor positioned within the environmentally controllable space, wherein the pressure sensor is in communication with the environment controller and wherein the environment controller is in communication with the pressurizing apparatus and is configured to maintain a pressure of less than approximately 60 PSI in the environmentally controllable space, wherein the humidifier apparatus is a gas bubbler with a cavity for a fluid in which gas may be introduced to allow the gas to be used as a carrier of the fluid into the environmentally controllable space, wherein the fluid contains pure deionized water or wherein the fluid contains deionized water which is chemically dosed with a surface passivation or reduction agent, tetramethylammonium hydroxide (TMAH), or acid.

In some embodiments, an apparatus for extending a queue time of a die or a substrate for hybrid bonding may comprise an environmentally controllable space with a support for holding at least one die or substrate, wherein the environmentally controllable space is a standalone storage space or a substrate carrier, an environmentally sealable port of the environmentally controllable space which is configured to receive at least one plasma activated die or substrate, a gas velocity accelerator configured to recirculate one or more gases laterally across the support at a velocity of approximately 60 feet per minute to approximately 120 feet per minute, a filter which impedes on the one or more gases prior to the one or more gases flowing laterally across the support, a humidifier apparatus that is fluidly connected to the environmentally controllable space, wherein the humidifier apparatus enables controllable humidity levels within the environmentally controllable space, a pressurizing apparatus fluidly connected to the humidifier apparatus on an output and fluidly connected to at least one gas supply on an input, a relative humidity (RH) sensor positioned within the environmentally controllable space, and an environment controller in communication with at least the humidifier apparatus and the RH sensor, wherein the environment controller is configured to maintain an RH level of approximately 80% to approximately 95%.

In some embodiments, the apparatus may further include a temperature sensor positioned within the environmentally controllable space, wherein the temperature sensor is in communication with the environment controller and wherein the environment controller is configured to maintain a temperature of less than approximately 100 degrees Celsius in the environmentally controllable space or a pressure sensor positioned within the environmentally controllable space, wherein the pressure sensor is in communication with the environment controller and wherein the environment controller is in communication with the pressurizing apparatus and is configured to maintain a pressure of less than approximately 60 PSI in the environmentally controllable space.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a high-quality hybrid bonding experience with high yields by extending the queue time (or "Q time") after plasma activation of a substrate. The plasma activation is maintained by creating a controlled, humid micro-environment around an activated surface in an atmospheric mainframe (AMM), buffer chamber, or bonder, and the like to hydrate an activated surface, preserving the surface activation and elongating the Q-time. With properly preserved surface activation, the Q-time can be, at a minimum, advantageously extended to double or even triple the unpreserved activation Q-time.

Activated surfaces need to be bonded within a short Q-time, after which the activation is compromised, and bonding quality degrades significantly. In chip-on-wafer (CoW) hybrid bonding, however, the total activation-to-bonding elapsed time can be long due to prebonding queuing and bonder throughput. The inventors have observed that surface hydration after plasma activation can promote surface interaction and contact during hybrid bonding, but hydrating the surface requires an additional process, increasing processing time and lowering bonding yields.

The inventors have discovered that by using a highly humid controlled environment (with or without chemical dosing) to hydrate and preserve plasma activated surfaces, the Q-time or activation period can be substantially increased. A relaxed Q-time requirement reduces rework counts and saves tool time and prevents alteration of surface profiles of copper bonding pads and dielectric materials from reworking. The inventors have found that in some embodiments if the activated surface kept in a highly humid environment (e.g., relative humidity >40%, or specific humidity >7 g/kg at room temperature and at 1 ATM) with or without inert gas (argon, nitrogen gas, etc.) purging, pressurized or with reduced pressure, when in queue for bonding and/or during bonding. The same concept on water can also be applied to vapor concentration of deionized (DI) water-diluted reducing/passivating agent such as acetic acid, oxalic acid, tetramethylammonium hydroxide (TMAH), dimethyl sulfoxide (DMSO), or acid (i.e., chemically dosed humid environment).

Figure 1:
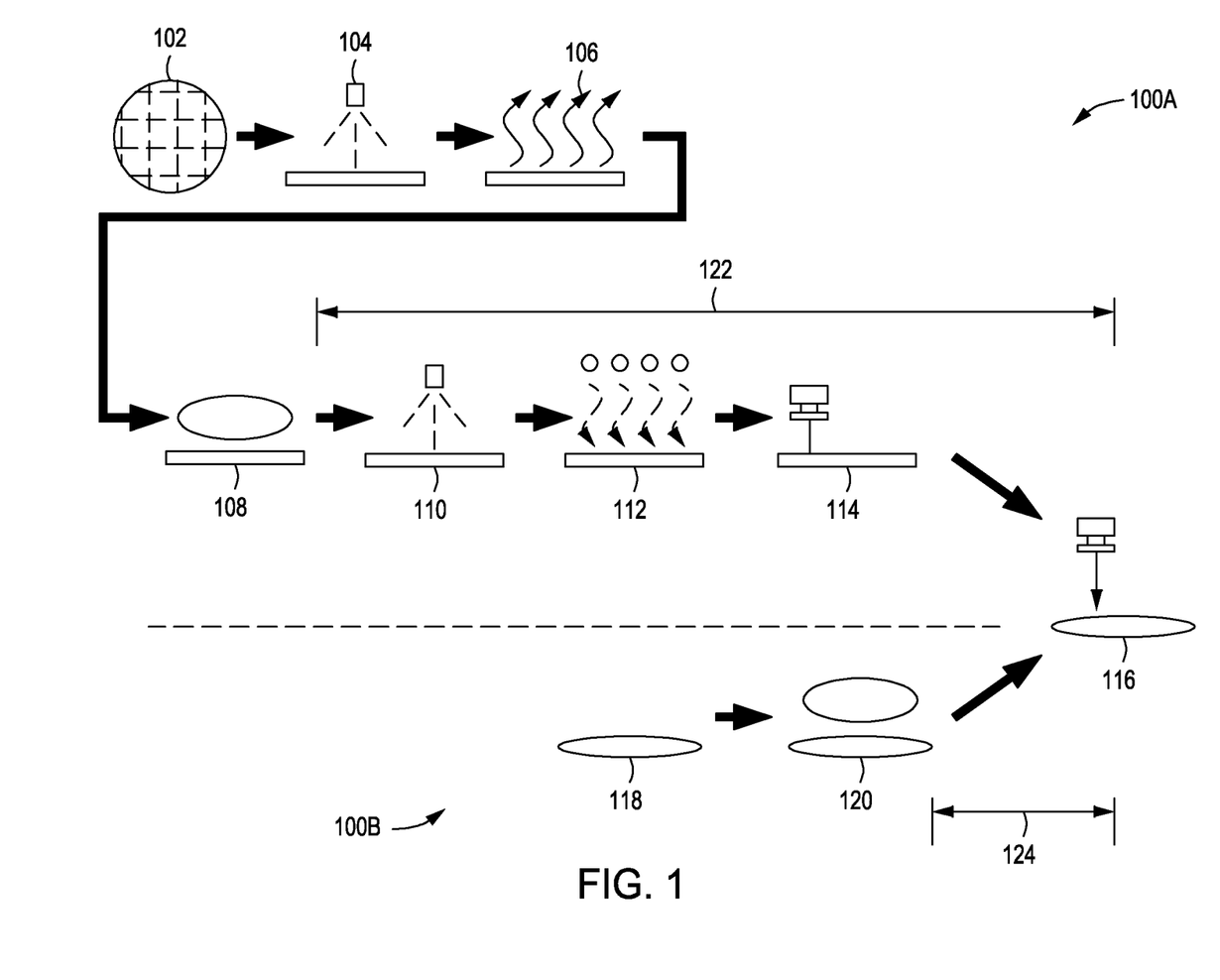
FIG. 1 depicts a process flow for hybrid bonding in accordance with some embodiments of the present principles.

FIG. 1 depicts processing flows for a hybrid bonding process. The processing stages for the dies are shown in view 100A, and the processing stages for the substrate on which the dies are bonded are shown in view 100B. In view 100A, a substrate with dies or component wafer is prepared and sent for hybrid bonding. The preparation may include upstream processing such as patterning, chemical mechanical polishing (CMP), back grinding, dicing, and the like. The dies are separated (singulated) and held together on the back side by dicing tape in a first die process 102, creating a component wafer. The process flow of view 100A is meant as an example and other flows with more or less stages may be used. The dies are then wet cleaned in a second die process 104 and degassed in third process 106 in preparation for activating the die surfaces for bonding. The dies are then placed in a process chamber and exposed to plasma to activate the die surfaces for bonding in a fourth die process 108. When the dies leave the plasma process chamber, a die queue (Q) time period 122 immediately begins to run. During the die Q time, the dies are wet cleaned and hydrated in a fifth die process 110, subjected to ultraviolet (UV) radiation to release the dies from the dicing tape in a sixth die process 112, and undergo die ejection and picking in a seventh die process 114. When the dies are placed and bonded on a substrate in a hybrid bonding process 116, the die Q time period 122 ends.

The substrate on which the dies are bonded also undergoes plasma activation processes as shown in the view 100B which, in some embodiments may or may not occur simultaneously with the processes shown in the view 100A. In some embodiments, the substrate is prepared in a first substrate process 118 that may include multiple processes and may be with or without a silicon underlayer or may be a glass-supported silicon wafer depending on process flow and use cases. The substrate is then subjected to activation by plasma in a process chamber in a second substrate process 120. When the substrate leaves the plasma process chamber, a substrate queue (Q) time period 124 immediately begins to run. When dies are placed on the substrate in the hybrid bonding process 116, the substrate Q time period 124 ends. In other words, the substrate Q time period 124 and the die Q time period 122 begin immediately after plasma activation and end at the moment that the die and substrate are bonded together by a bonding process.

The substrate may have one to hundreds of dies bonded to the surface of the substrate in one or more bonding sessions. Whereas a single die may have a single Q time period (activation to bonding period), the substrate may have hundreds of Q time periods (one Q time period for each die to be bonded onto the substrate). In some instances, the substrate may spend 10's of hours in a hybrid bonder before all dies are bonded to the substrate. As such, with traditional processes, the initial activated dies bonded to the activated substrate may be void free with high bonding performance, but later bonded dies (more than 20 hours, etc.) may begin to show voids and other bonding defects as the activation of both the substrate and later placed dies begins to diminish substantially. Thus, the inventors have found that for high bonding performance, extending the Q time period of the dies and the substrate is critical even after the dies and substrate enter the hybrid bonder apparatus due to long bonding process times.

The industry standard acceptable Q time period for a die or substrate is usually 7 to 20 hours. If bonding has not taken place by the acceptable time period, the dies and/or substrate must be re-activated before bonding can occur, increasing processing times and decreasing bonding yields. The inventors have discovered that in order to preserve the activation (extend the Q time) of the die surfaces and substrate surfaces, the surfaces should be kept in a high humidity environment. If the dies and substrate are kept in a high relative humidity environment, the Q time may be extended almost indefinitely. In some embodiments, dies and substrates stored in a relative humidity environment of approximately 80% to approximately 95% or higher maintained surface activation for more than 125 hours. The five-to-ten-fold increase in Q time over traditional processes removes the Q time as a critical period in the bonding process, decreasing the bonding process time (no need to re-activate surfaces) and increasing bonding yields (maintained activated surfaces bond with higher performance).

Figure 2:
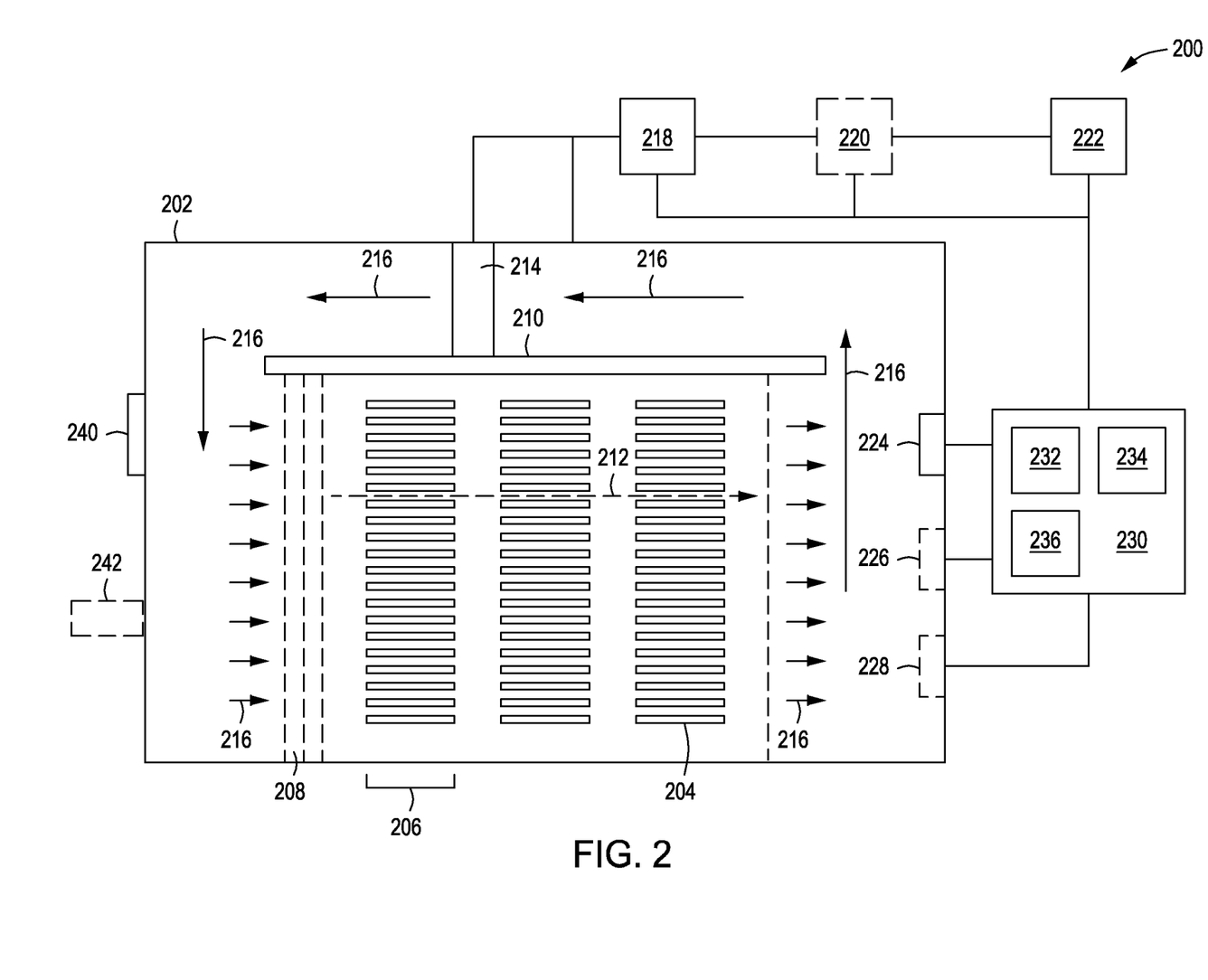
FIG. 2 depicts a cross-sectional view of an apparatus for controlling an environment to preserve activated surfaces for hybrid bonding in accordance with some embodiments of the present principles.

FIG. 2 is an apparatus 200 for extending a queue time of a die or substrate for hybrid bonding. The apparatus 200 includes an environmentally controllable space 202 with a support 210 for holding at least one die or substrate 204. The environmentally controllable space 202 is typically sealed with a sealable port 240 for placing and removing dies and/or substrates on or off of the support 210. The environmentally controllable space 202 may also have an optional environment discharge port 242 (discussed below). In some embodiments, the support 210 may hold more than one vertical stack 206 of dies or substrates. The vertical stack 206 provides support while allowing laminar gas flow 212 across the surfaces of the dies or substrates 204. The laminar gas flow 212 is provided by a gas velocity accelerator 214 that recirculates one or more gases laterally across the dies and substrates 204 in the support 210. To achieve a particle free environment, gas velocity and pressure are used to push any particles away from the dies and substrates 204. In some embodiments, the gas velocity accelerator 214 may be a recirculating fan and the like that is configured to accelerate gases between approximately 60 feet per minute to approximately 120 feet per minute. The gas velocity accelerator 214 cycles the gases through the environmentally controllable space 202 and over the dies and substrates 204 in a direction indicated by the arrows 216. When the gases leave the gas velocity accelerator 214, the gases travel through a filter 208 before flowing across the dies or substrates 204 (e.g., laminar gas flow 212). In some embodiments, the filter 208 may be a high efficiency particulate air (HEPA) filter. The filter 208 enables the environmentally controllable space 202 to meet ultraclean ISO class 1 or 2 requirements for cleanliness.

The environmentally controllable space 202 is fluidly connected to a humidifier apparatus 218. The humidifier apparatus 218 is configured to enable controllable humidity levels within the environmentally controllable space 202. In some embodiments, the humidifier apparatus 218 may be a gas bubbler with a cavity for a fluid in which gas may be introduced to allow the gas to be used as a carrier of the fluid into the environmentally controllable space 202. In some embodiments, the fluid may be deionized water (DIW) or DIW that is chemically dosed with a surface passivation or reduction agent such as, but not limited to, tetramethylammonium hydroxide (TMAH) or acid and the like. In some embodiments, an optional pressurizing apparatus 220 may be fluidly connected to the humidifier apparatus 218, such as the gas bubbler, on an output and fluidly connected to at least one gas supply 222 of a carrier gas on an input to pressurize the gas through the fluid in the cavity of the gas bubbler. The carrier gas may be air, nitrogen, argon, and/or oxygen or a mixture and the like. In some embodiments, the humidifier apparatus 218 may be a heated evaporator.

A relative humidity (RH) sensor 224 is positioned within the environmentally controllable space 202 to measure the level of relative humidity in the environmentally controllable space 202. In some embodiments, an optional temperature sensor 226 is positioned within the environmentally controllable space 202. The optional temperature sensor 226 is configured to facilitate in maintaining a temperature of less than approximately 100 degrees Celsius in the environmentally controllable space 202. In some embodiments, an optional pressure sensor 228 is positioned within the environmentally controllable space 202. The optional pressure sensor 228 is configured to facilitate in maintaining a pressure of less than approximately 60 PSI in the environmentally controllable space 202.

In some embodiments, the relative humidity, pressure, gas recirculation velocity, temperature, and/or dosing of the deionized water in the environmentally controllable space 202 may be controlled by an environment controller 230. The environment controller 230 may be a dedicated controller only for the environmentally controllable space 202 or may be part of a process controller/cluster tool controller and the like. In some embodiments, the environment controller 230 may be in communication with at least the humidifier apparatus 218 and the RH sensor 224 to maintain an RH level of approximately 80% to approximately 95%. In some embodiments, the environment controller 230 may also be in communication with the optional temperature sensor 226 to facilitate in controlling the temperature in the environmentally controllable space 202 to 100 degrees Celsius or less and/or the optional pressure sensor 228 to facilitate in controlling the pressure in the environmentally controllable space 202 to 60 PSI or less.

The environment controller 230 may also be in communication with the optional pressurizing apparatus 220 and the gas supply 222 to facilitate in pressurizing the environmentally controllable space 202. The environment controller 230 may also be in communication with the gas velocity accelerator 214 to adjust the gas velocity between approximately 60 feet per minute and approximately 120 feet per minute. In some embodiments, an optional environment discharge port 242 may be mechanically operated by a valve interface and or electrically operated by, for example, the environment controller 230 to discharge a portion of the atmosphere from the environmentally controllable space 202 into another space (not shown, described below) such as, for example but not limited to, a storage container or factory interface (FI) or wafer carrier and the like. The storage container or wafer carrier can then be used to transport dies or substrates to another location without the loss of activation (loss of Q time) of the dies or substrates and without the need or expense of environmental support apparatus (e.g., humidifier, gases, pressure, temperature, etc.).

The environment controller 230 controls the operation of the environmentally controllable space 202 using a direct control of the associated apparatus or alternatively, by controlling the computers (or controllers) associated with the environmentally controllable space 202. In operation, the environment controller 230 enables data collection and feedback from the respective apparatus and systems to optimize performance of the environmentally controllable space 202. The environment controller 230 generally includes a Central Processing Unit (CPU) 232, a memory 234, and a support circuit 236. The CPU 232 may be any form of a general-purpose computer processor that can be used in an industrial setting. The support circuit 236 is conventionally coupled to the CPU 232 and may comprise a cache, clock circuits, input/output subsystems, power supplies, and the like. Software routines may be stored in the memory 234 and, when executed by the CPU 232, transform the CPU 232 into a specific purpose computer (environment controller 230). The software routines may also be stored and/or executed by a second controller (not shown) that is located remotely from the environmentally controllable space 202.

The memory 234 is in the form of computer-readable storage media that contains instructions, when executed by the CPU 232, to facilitate the operation of the environmentally controllable space 202 and associated apparatus. The instructions in the memory 234 are in the form of a program product such as a program that implements control methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 3:
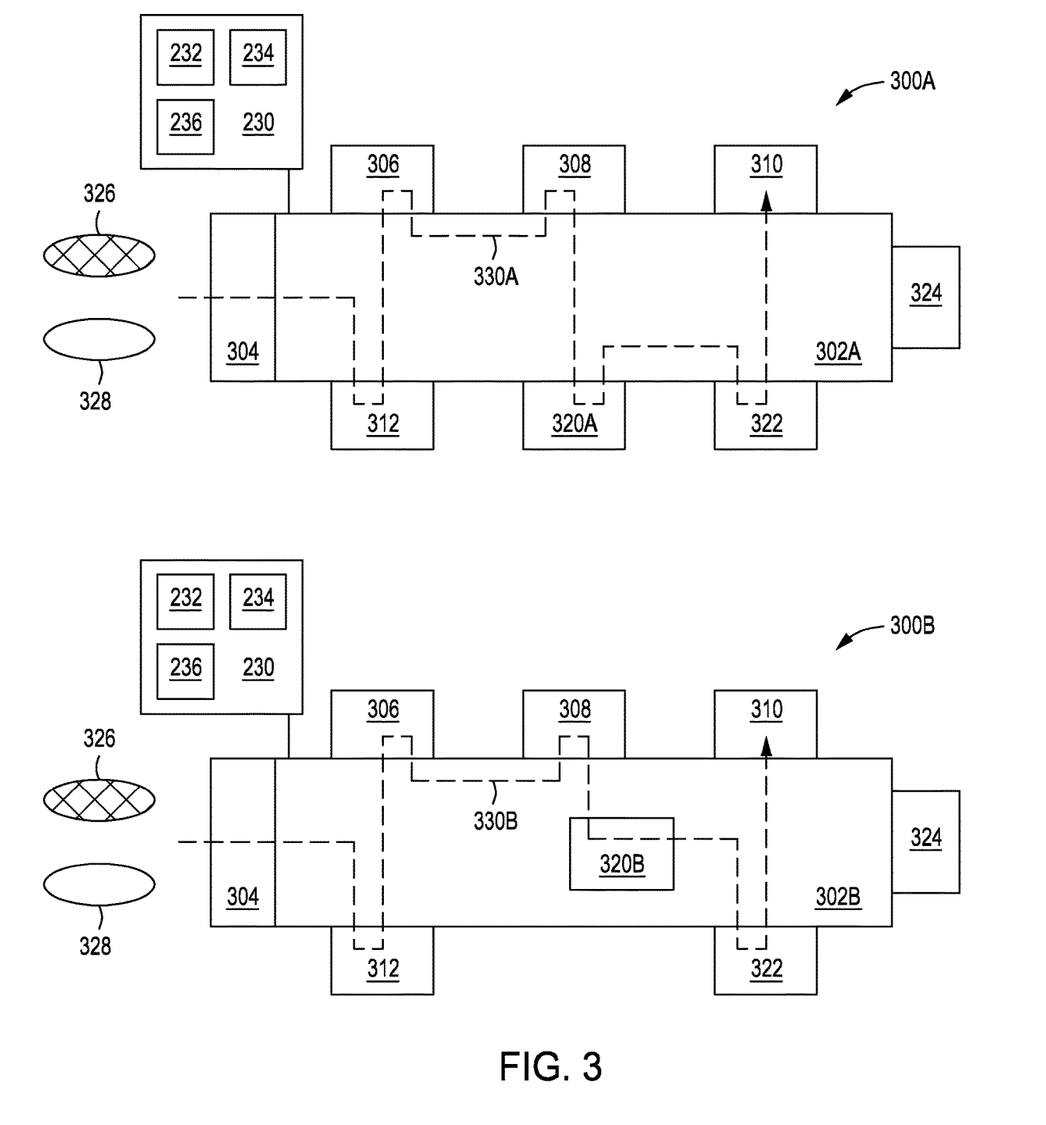
FIG. 3 depicts top-down views of integrated tools with controlled environments for preserving activated surfaces for hybrid bonding in accordance with some embodiments of the present principles.

The apparatus 200 of FIG. 2 may be incorporated into different systems and also storage containers and substrate/wafer/die carriers and the like. Examples of some embodiments are depicted in views 300A and 300B for an integrated or cluster tool used for hybrid bonding. The examples are not meant to be limiting in how the apparatus 200 may be integrated into different platforms and tools. In view 300A, an integrated hybrid bonding platform includes a mainframe 302A in which dies 326 and/or substrates 328 may be moved between tools in a controlled environment (e.g., atmospheric or under vacuum, etc.). The mainframe 302A include a factory interface (FI) 304 that can receive dies 326 or substrates 328 that have been previously constructed and are now moving to the hybrid bonding process. As denoted by dashed line 330A, the dies 326 and/or substrates 328 may, as an example, travel from the FI 304 to a wet cleaning station 312, then to a degassing station 306, and then into a plasma chamber 308 for surface activation. The dies 326 and/or substrates 328 are then moved into a storage chamber 320A that is attached to the mainframe 302A for storing until dies 326 and/or substrates 328 are ready to progress to a UV die release station 322 and then on to the bonding station 310. The mainframe 302A may also include other stations/apparatus 324 for annealing and/or baking and the like. The storage chamber 320A of the mainframe 302A is configured similar to the apparatus 200 of FIG. 2 to enable a high RH environment to store the dies 326 and/or substrates 328 while the dies 326 and/or substrates 328 wait to be bonded in order to maintain (extend) the surface activation of the dies 326 and/or substrates 328.

In view 300B, an integrated hybrid bonding platform includes a mainframe 302B in which dies 326 and/or substrates 328 may be moved between tools in a controlled environment (e.g., under vacuum, etc.). The mainframe 302A include a factory interface (FI) 304 that can receive dies 326 and/or substrates 328 that have been previously constructed and are now moving to the hybrid bonding process. As denoted by dashed line 330B, the dies 326 and/or substrates 328 travel from the FI 304 to a wet cleaning station 312, then to a degassing station 306, and then into a plasma chamber 308 for surface activation. The dies 326 and/or substrates 328 are then moved into a storage chamber 320B that is integrated into the interior area of the mainframe 302B for storing until dies 326 and/or substrates 328 are ready to progress to a UV die release station 322 and then on to the bonding station 310. The mainframe 302B may also include other stations/apparatus 324 for annealing and/or baking and the like. The storage chamber 320B of the mainframe 302B is configured similar to the apparatus 200 of FIG. 2 to enable a high RH environment to store the dies 326 and/or substrates 328 while the dies 326 and/or substrates 328 wait to be bonded in order to maintain (extend) the surface activation of the dies 326 and/or substrates 328.

Figure 4:
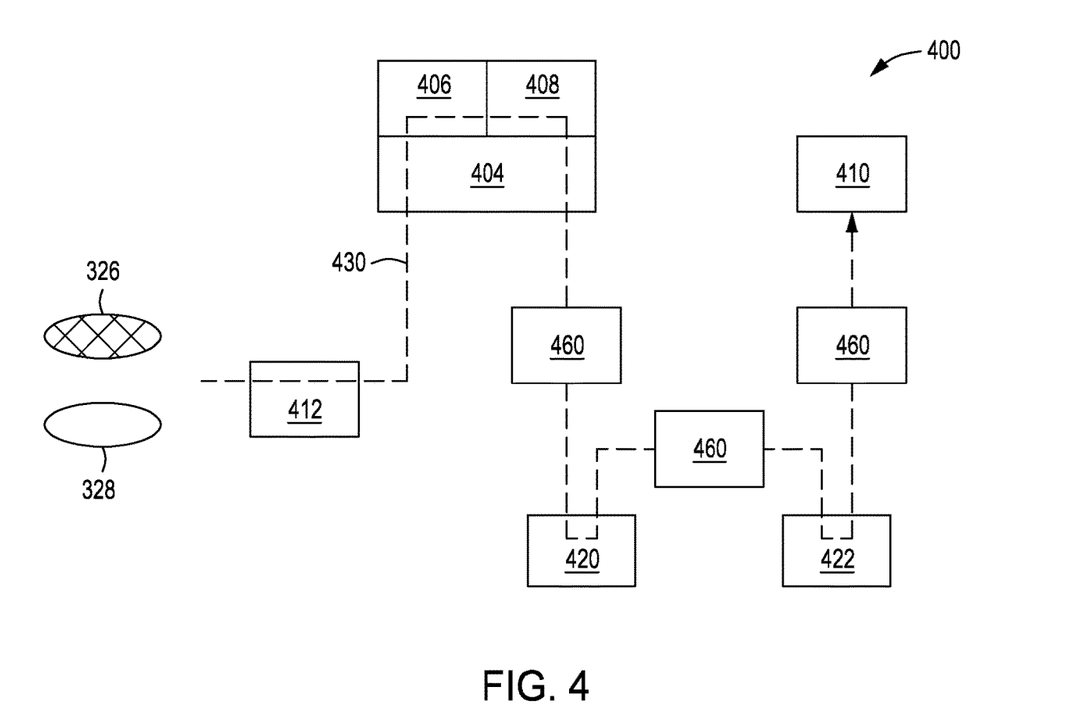
FIG. 4 depicts a top-down view of standalone tools and controlled environments for preserving activated surfaces for hybrid bonding in accordance with some embodiments of the present principles.

The apparatus 200 of FIG. 2 may also be used in conjunction with standalone tools used for hybrid bonding processing such as depicted in view 400 of FIG. 4. The example is not meant to be limiting on how the apparatus 200 may be integrated into different standalone tool groupings. In view 400, a standalone wet cleaning station 412 receives dies 326 and/or substrates 328 that have been previously constructed and are now moving through standalone hybrid bonding process stations. As denoted by dashed line 430, the dies 326 and/or substrates 328 travel from the standalone wet cleaning station 412 to an FI 404, then to a degassing station 406, and then into a plasma chamber 408 for surface activation. The dies 326 and/or substrates 328 are then moved into a standalone storage chamber 420 via a container 460 that is filled with high RH gases. In some embodiments, the FI 404 may include the apparatus 200 of FIG. 2 and includes an optional environment discharge port 242 that can be used to fill the container 460 with high RH gas for transporting the dies 326 and/or the substrates 328 to the standalone storage chamber 420. The container 460 may include, for example but not limited to, a front opening unified pod (FOUP), a front opening shipping box (FOSB), an equipment front end module, or a substrate carrier and the like. The standalone storage chamber 420 provides storage until the dies 326 and/or substrates 328 are ready to progress to a UV release station 422 and then on to the bonding station 410. The standalone storage chamber 420 includes the apparatus 200 of FIG. 2 and may also include the optional environment discharge port 242 to fill the container 460 with high RH gas for transporting the dies 326 and/or the substrates 328 on to the UV release station 422 and then to the bonding station 410.

Figure 5:
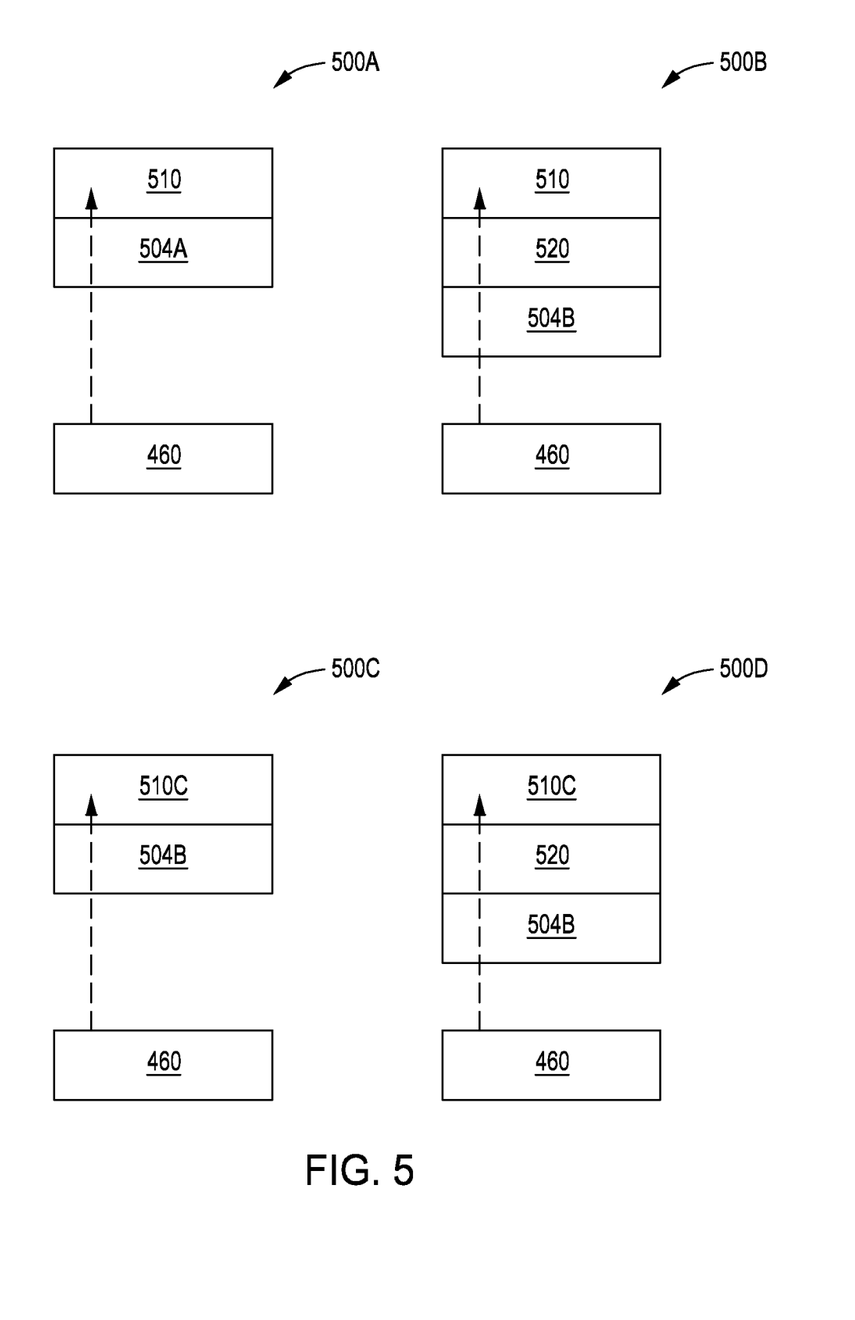
FIG. 5 depicts a top-down view of hybrid bonding stations with controlled environments for preserving activated surfaces in accordance with some embodiments of the present principles.

The apparatus 200 of FIG. 2 may also be used in conjunction with a hybrid bonding station that may or may not be integrated into an integrated/cluster tool as depicted in views 500A, 500B, 500C, and 500D of FIG. 5. In other words, the examples that follow may be used in a standalone hybrid bonding station or a hybrid bonding station incorporated into a cluster tool with a mainframe (see, e.g., FIG. 3). In some embodiments, the bonding station 510 may have an FI 504A that is equipped with the apparatus 200 of FIG. 2 including the optional environment discharge port 242 as depicted in view 500A of FIG. 5. The container 460 is used to transport dies and/or substrates to the bonding station 510 via the FI 504A and is equipped to interface with the optional environment discharge port 242 of the FI 504A in order to fill/re-fill the container 460 with high RH gas. The dies and/or substrates can then be stored in the FI 504A without loss of activation until the bonding process becomes available in the bonding station 510. In some embodiments, the bonding station 510 may have a storage buffer 520 that is equipped with the apparatus 200 of FIG. 2 as depicted in view 500B of FIG. 5. The bonding station 510 may also include an FI 504B that may or may not include the apparatus 200 of FIG. 2 and the optional environment discharge port 242. The container 460 is used to transport dies and/or substrates to the bonding station 510 via the FI 504B and is equipped to interface with the optional environment discharge port 242 of the FI 504B, if present, in order to fill/re-fill the container 460 with high RH gas. The dies and/or substrates can then be stored in the storage buffer 520 without loss of activation until the bonding process becomes available in the bonding station 510.

In some embodiments, the bonding station 510C is equipped with the apparatus 200 of FIG. 2 as depicted in view 500C of FIG. 5. The bonding station 510C may also include an FI 504B that may or may not include the apparatus 200 of FIG. 2 and the optional environment discharge port 242. The container 460 is used to transport dies and/or substrates to the bonding station 510 via the FI 504B and is equipped to interface with the optional environment discharge port 242 of the FI 504B, if present, in order to fill/re-fill the container 460 with high RH gas. The dies and/or substrates can then be stored in the FI 504B and/or the bonding station 510C without loss of activation until the bonding process becomes available or is completed in the bonding station 510. A bonder that incorporates the apparatus 200 enables many dies to be picked and placed on a substrate without concern of diminished bonding performance due to surface activation losses of traditional processes. In some embodiments, the bonding station 510C is equipped with the apparatus 200 of FIG. 2 as depicted in view 500D of FIG. 5 and has a storage buffer 520 that is equipped with the apparatus 200 of FIG. 2 as depicted in view 500D of FIG. 5. The bonding station 510C may also include an FI 504B that may or may not include the apparatus 200 of FIG. 2 and the optional environment discharge port 242. The container 460 is used to transport dies and/or substrates to the bonding station 510 via the FI 504B and is equipped to interface with the optional environment discharge port 242 of the FI 504B, if present, in order to fill/re-fill the container 460 with high RH gas. The dies and/or substrates can then be stored in the bonding station 510C, the storage buffer 520, and/or the FI 504B without loss of activation until the bonding process becomes available or is completed in the bonding station 510.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for extending a queue time of a die or a substrate for hybrid bonding, comprising:
   an environmentally controllable space with a support for holding at least one die or substrate;
   a gas velocity accelerator that recirculates one or more gases laterally across the support;
   a filter which impedes on the one or more gases prior to the one or more gases flowing laterally across the support;
   a humidifier apparatus that is fluidly connected to the environmentally controllable space, wherein the humidifier apparatus enables controllable humidity levels within the environmentally controllable space;
a pressurizing apparatus fluidly connected to the humidifier apparatus on an output and fluidly connected to at least one gas supply on an input;
a relative humidity (RH) sensor positioned within the environmentally controllable space; and
an environment controller in communication with at least the humidifier apparatus and the RH sensor, and the pressurizing apparatus, wherein the environment controller is configured to maintain an RH level of approximately 80% to approximately 95% and a pressure of less than approximately 60 PSI in the environmentally controllable space.

2. The apparatus of claim 1, wherein the support holds multiple vertical stacks of dies or substrates in one or more columns.

3. The apparatus of claim 1, wherein the gas velocity accelerator is configured to recirculate the one or more gases at a velocity of approximately 60 feet per minute to approximately 120 feet per minute.

4. The apparatus of claim 1 integrated into a factory interface (FI).

5. The apparatus of claim 1, further comprising:
a temperature sensor positioned within the environmentally controllable space, wherein the temperature sensor is in communication with the environment controller and wherein the environment controller is configured to maintain a temperature of less than approximately 100 degrees Celsius in the environmentally controllable space.

6. The apparatus of claim 1, further comprising:
a pressure sensor positioned within the environmentally controllable space, wherein the pressure sensor is in communication with the environment controller.

7. The apparatus of claim 1, wherein the humidifier apparatus is a gas bubbler with a cavity for a fluid in which gas may be introduced to allow the gas to be used as a carrier of the fluid into the environmentally controllable space.

8. The apparatus of claim 7, wherein the fluid contains deionized water.

9. The apparatus of claim 8, wherein the deionized water is chemically dosed with a surface passivation or reduction agent, tetramethylammonium hydroxide (TMAH), or acid.

10. The apparatus of claim 1, wherein the humidifier apparatus is a heated evaporator in communication with and controllable by the environment controller to alter levels of humidity within the environmentally controllable space.

11. The apparatus of claim 1 positioned in a process chamber or bonder integrated into a cluster tool or as a standalone tool.

12. The apparatus of claim 1 positioned in a non-processing area of a cluster tool.

13. The apparatus of claim 1 integrated into a standalone storage station.

14. The apparatus of claim 1 integrated into a substrate carrier.

15. An apparatus for extending a queue time of a die or a substrate for hybrid bonding, comprising:
an environmentally controllable space with a support for holding at least one substrate, wherein the environmentally controllable space is part of a cluster tool or a hybrid bonder chamber;
an environmentally sealable port of the environmentally controllable space which is configured to receive at least one die or substrate from a plasma activation process chamber;
a gas velocity accelerator configured to recirculate one or more gases laterally across the support at a velocity of approximately 60 feet per minute to approximately 120 feet per minute;
a filter which impedes on the one or more gases prior to the one or more gases flowing laterally across the support;
a humidifier apparatus that is fluidly connected to the environmentally controllable space, wherein the humidifier apparatus enables controllable humidity levels within the environmentally controllable space;
a pressurizing apparatus fluidly connected to the humidifier apparatus on an output and fluidly connected to at least one gas supply on an input;
a relative humidity (RH) sensor positioned within the environmentally controllable space; and
an environment controller in communication with at least the humidifier apparatus and the RH sensor, wherein the environment controller is configured to maintain an RH level of approximately 80% to approximately 95%.

16. The apparatus of claim 15, wherein the humidifier apparatus is a gas bubbler with a cavity for a fluid in which gas may be introduced to allow the gas to be used as a carrier of the fluid into the environmentally controllable space, wherein the fluid contains pure deionized water or wherein the fluid contains deionized water which is chemically dosed with a surface passivation or reduction agent, tetramethylammonium hydroxide (TMAH), or acid.

17. The apparatus of claim 15, further comprising:
a temperature sensor positioned within the environmentally controllable space, wherein the temperature sensor is in communication with the environment controller and wherein the environment controller is configured to maintain a temperature of less than approximately 100 degrees Celsius in the environmentally controllable space; or a pressure sensor positioned within the environmentally controllable space, wherein the pressure sensor is in communication with the environment controller and wherein the environment controller is in communication with the pressurizing apparatus and is configured to maintain a pressure of less than approximately 60 PSI in the environmentally controllable space.

18. An apparatus for extending a queue time of a die or a substrate for hybrid bonding, comprising:
an environmentally controllable space with a support for holding at least one die or substrate, wherein the environmentally controllable space is a standalone storage space or a substrate carrier;
an environmentally sealable port of the environmentally controllable space which is configured to receive at least one plasma activated die or substrate;
a gas velocity accelerator configured to recirculate one or more gases laterally across the support at a velocity of approximately 60 feet per minute to approximately 120 feet per minute;
a filter which impedes on the one or more gases prior to the one or more gases flowing laterally across the support;
a humidifier apparatus that is fluidly connected to the environmentally controllable space, wherein the humidifier apparatus enables controllable humidity levels within the environmentally controllable space;
a pressurizing apparatus fluidly connected to the humidifier apparatus on an output and fluidly connected to at least one gas supply on an input;

a relative humidity (RH) sensor positioned within the environmentally controllable space; and an environment controller in communication with at least the humidifier apparatus and the RH sensor, wherein the environment controller is configured to maintain an RH level of approximately 80% to approximately 95%.

19. The apparatus of claim 18, further comprising:

a temperature sensor positioned within the environmentally controllable space, wherein the temperature sensor is in communication with the environment controller and wherein the environment controller is configured to maintain a temperature of less than approximately 100 degrees Celsius in the environmentally controllable space; or a pressure sensor positioned within the environmentally controllable space, wherein the pressure sensor is in communication with the environment controller and wherein the environment controller is in communication with the pressurizing apparatus and is configured to maintain a pressure of less than approximately 60 PSI in the environmentally controllable space.

\* \* \* \* \*